United States Patent
Hsia et al.

[19]

[11] Patent Number: 6,057,576
[45] Date of Patent: May 2, 2000

[54] INVERSE-T TUNGSTEN GATE APPARATUS

[75] Inventors: Liang-Choo Hsia, Taipei, Taiwan; Thomas Tong-Long Chang, Santa Clara, Calif.

[73] Assignee: Mosel Vitelic, Inc., Hsinchu, Taiwan

[21] Appl. No.: 09/160,552

[22] Filed: Sep. 24, 1998

Related U.S. Application Data

[62] Division of application No. 08/650,530, May 20, 1996, Pat. No. 5,858,867.

[51] Int. Cl.[7] .......................... H01L 27/01; H01L 27/12; H01L 31/0392
[52] U.S. Cl. .......................... 257/344; 257/350; 257/377; 257/382; 257/383; 257/384; 257/412; 257/413; 257/754; 257/755; 257/756; 257/757; 257/770; 257/388
[58] Field of Search .................... 257/344, 350, 257/377, 382, 383, 384, 412, 754–757, 770, 413, 388

[56] References Cited

U.S. PATENT DOCUMENTS

| | | | |
|---|---|---|---|
| 4,128,670 | 12/1978 | Gaensslen | 427/86 |
| 4,227,944 | 10/1980 | Brown et al. | 148/6 |
| 4,472,237 | 9/1984 | Deslauriers et al. | 156/643 |
| 4,502,204 | 6/1984 | Togashi et al. | 29/571 |
| 4,716,131 | 12/1987 | Okazawa et al. | 437/200 |
| 5,102,815 | 4/1992 | Sanchez | 437/44 |
| 5,115,290 | 5/1992 | Murakami et al. | 357/23.9 |
| 5,147,814 | 9/1992 | Takeuchi | 437/44 |
| 5,304,504 | 4/1994 | Wei et al. | 437/44 |
| 5,449,642 | 9/1995 | Tan et al. | 437/200 |
| 5,545,578 | 8/1996 | Park et al. | 437/44 |
| 5,599,725 | 2/1997 | Dorleans et al. | 437/40 |

*Primary Examiner*—Mahshid Saadat
*Assistant Examiner*—Matthew Warren
*Attorney, Agent, or Firm*—Townsend and Townsend and Crew LLP

[57] ABSTRACT

A technique for fabricating an integrated circuit device 100 using an inverse-T tungsten gate structure 121 overlying a silicided layer 119 is provided. This technique uses steps of forming a high quality gate oxide layer 115 overlying a semiconductor substrate 111. The silicided layer 119 is defined overlying the gate oxide layer 115. The silicided layer 119 does not substantially react to this layer. The technique defines the inverse-T tungsten gate electrode layer 121 overlying the silicided layer 119. A top surface of this gate electrode may also be silicided 127 to further reduce the resistance of this device element.

17 Claims, 3 Drawing Sheets

INVERSE-T TUNGSTEN GATE APPARATUS

This application is a division of and claims the benefit of U.S. application Ser. No. 08/650,530, filed May 20, 1996, now U.S. Pat. No. 5,858,867 the disclosure of which is incorporated by reference.

BACKGROUND OF THE INVENTION

The present invention relates to the manufacture of semiconductor integrated circuits. More particularly, the invention provides a technique including a method and device for fabrication of a metal oxide semiconductor (MOS) transistor using an improved inverse-T gate structure. But it will be recognized that the invention has a wider range of applicability; it can also be applied to the manufacture of complementary metal oxide semiconductor (CMOS) devices, bipolar complementary metal oxide semiconductor (BiCMOS) devices, and others.

In the manufacture of semiconductor integrated circuits, device geometries are becoming increasingly smaller. These smaller device geometries (e.g., submicron sized) tend to cause a variety of problems during switching of the circuits. One of these problems is known as the hot electron injection phenomena. During switching, hot electrons inject into a portion of the gate electrode, which increases the amount of charge to build underlying this gate electrode portion. This increased charge often causes switching degradation. A variety of techniques have been proposed in an attempt to eliminate this problem.

One attempt is the lightly doped drain (LDD) structure 13 in a MOS transistor 10, as illustrated by FIG. 1. This LDD structure 13 reduces the electric field underlying the gate electrode region, thereby causing fewer electrons to inject into the gate electrode 14. As shown, the gate electrode is defined overlying a gate dielectric layer 16. The LDD region 13 reduces the electric field by providing a lightly doped drain region (e.g., N– impurities) 15 between the transistor channel region 17 and an adjacent source/drain region 19. The LDD region 15 is defined in a well region (e.g., P-type well) 21 formed in a semiconductor substrate 23. A two step ion implantation technique using sidewall spacers 21 defines the LDD and source/drain regions.

As device geometries become smaller, however, hot electrons become trapped in the sidewall spacers, thereby increasing the amount of charge underlying the gate electrode. As shown by the reference arrows in FIG. 1, hot electrons inject into portions of the sidewall spacers. This tends to accumulate the amount of charge (i.e., positively charged species) underlying the spacers due to the negatively charged electrons trapped in the spacers. The increased charge underlying the spacers detrimentally effects device switching.

Another technique that has been proposed to reduce the hot electron injection problem is an inverse-T transistor gate structure. In this structure, a portion of the gate electrode extends beneath the sidewall spacers, which also surrounds and insulates the gate electrode structure. This extended portion of the gate electrode beneath the sidewall spacers often improves transistor performance by providing improved gate controllability.

In this inverse-T gate structure, polysilicon has been widely used as the material for the inverse-T gates. The gates are made from a polysilicon film, which is defined overlying a gate oxide layer. Unfortunately, this polysilicon film has inherent limitations. In particular, polysilicon gates have a relatively high resistance, typically at about 60 ohms/square. The high resistance of these gates become even greater as the size of these devices are scaled down, e.g., submicron sized gates. In addition, it also is difficult to suppress short channel effects when using these structures for a buried channel MOSFET.

Thus, tungsten gates using CMOS technology were proposed. Tungsten gates generally possess a lower sheet resistance. Devices having a tungsten gate often have a 30% transconductance increase and have a low subthreshold slope value, which is responsible for a large on/off ratio. Tungsten is effective as a material for CMOS transistor gates because its work function is near silicon mid-bandgaps. This provides symmetrical operation for N-type and P-type channel devices with equal threshold values.

Although tungsten seems to be a workable material for CMOS gate electrodes, it is not without limitations. In particular, tungsten forms volatile oxides with the gate oxide layer at relatively low temperatures during device operation. Also, during the transistor fabrication process, inherent damage often occurs to the gate silicon oxide, which necessitates regrowth. This typically occurs by oxidizing the silicon at temperatures of 900–1000° C. in oxygen ambient for a period of time. Accordingly, tungsten gates also have limitations with these devices having submicron sized linewidths.

From the above, it is seen that a technique for forming an improved MOS gate structure, which reduces the hot electron injection problem, is often desirable.

SUMMARY OF THE INVENTION

According to the present invention, a technique for fabrication of an inverse-T gate electrode with an underlying silicided layer is provided. The present technique improves transistor switching performance by providing fewer hot electrons that injected themselves into the transistor gate during switching.

In one embodiment, a method of forming an integrated circuit device using a combination of an inverse-T tungsten gate electrode defined overlying a silicided layer is provided. This method uses steps of providing a partially completed semiconductor wafer. The partially completed semiconductor wafer comprises a gate insulating layer overlying a substrate. A silicided layer is formed overlying the gate insulating layer. An inverse-T gate electrode is formed overlying this silicided layer. The gate electrode can be made from a material selected from a group consisting of tungsten, titanium, and polysilicon.

In an alternative embodiment, a semiconductor device having a combination of an inverse-T tungsten gate electrode defined overlying a silicided layer is provided. This device is defined on a semiconductor substrate having an overlying gate insulating layer. The silicided layer is formed overlying this gate insulating layer, and the gate electrode overlies the silicided layer. The gate electrode can be made from a material selected from a group consisting of tungsten, titanium, and polysilicon. This combination of device elements substantially diminishes the hot electron injection phenomenon in submicron sized devices.

The present invention achieves these benefits in the context of known process technology. However, a further understanding of the nature and advantages of the present invention may be realized by reference to the latter portions of the specification and attached drawings.

DESCRIPTION OF THE SPECIFIC EMBODIMENT

Figure 1:
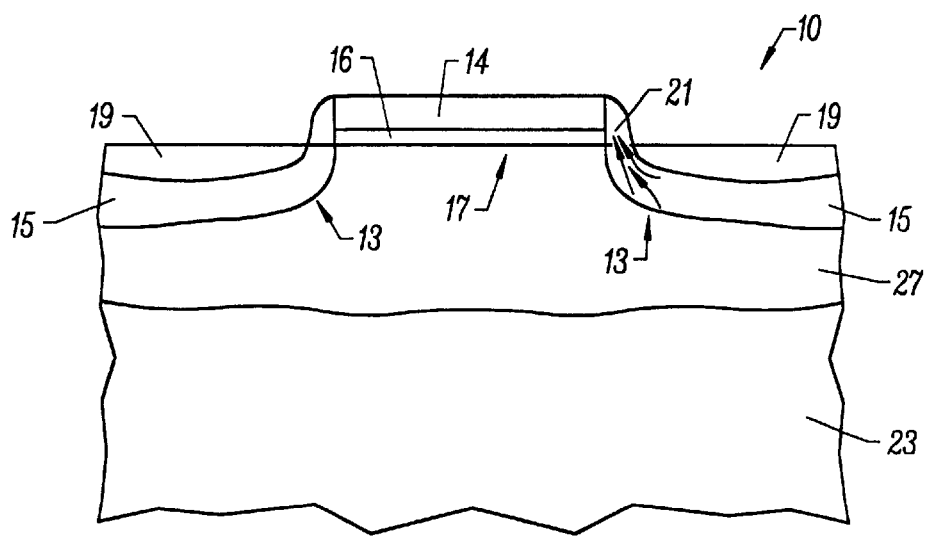
FIG. 1 is a simplified diagram of a MOS transistor having a conventional LDD structure.
Figure 2:
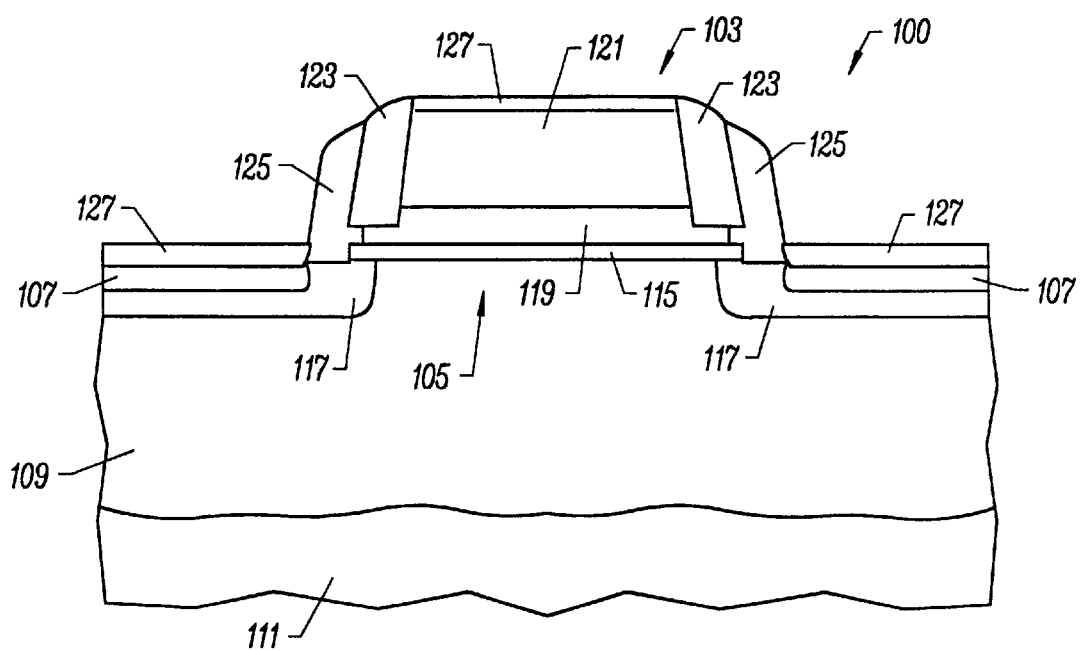
FIG. 2 is a simplified diagram of a MOS transistor having an inverse-T gate structure according to the present invention.

FIG. 2 is a simplified diagram of a MOS device 100 using an inverse-T gate structure according to the present invention. FIG. 2 is merely an illustration and should not limited the scope of the claims described herein. One of ordinary skill in the art would be able to provide other variations, alternatives, and modifications.

The MOS device 100 includes a gate electrode region 103, a channel region 105, and source/drain region(s) 107. Merely as an example, the MOS device 100 is fabricated on a p-type well region 109 in a semiconductor substrate 111. This MOS device 100 has an n-impurity type channel region 105, defining an NMOS device structure. A gate dielectric layer 115 is defined overlying the channel region 105. The gate dielectric layer 115 is often a high quality oxide layer or the like. Each source/drain region(s) 107 includes N-type impurities, e.g., phosphorous. This MOS device also includes lightly doped drain regions 117, each located between the channel region 105 and source/drain region(s) 107.

A thin layer of silicide 119 is defined overlying the gate dielectric layer 115. The layer of silicide 119 can be made of any suitable elements capable of adhering well to the gate dielectric layer and being fairly unreactive also with such gate dielectric layer. An example of the silicide can be a tungsten silicide, a titanium silicide, a platinum silicide, cobalt silicide, and others. Preferably, the silicide is a tungsten silicide.

The gate electrode region has a gate electrode 121 made of tungsten. Tungsten has relatively low resistivity as compared to doped polysilicon. Tungsten also is often easy to apply using conventional techniques. Examples of these techniques include chemical vapor deposition (CVD), sputtering (e.g., PVD), and the like. Of course, the technique used will depend upon the application.

First sidewall spacers 123 are defined adjacent to the edges of the tungsten gate electrode 121. These first sidewall spacers 123 can be made using any suitable technique. An example of such a technique includes formation of an oxide layer using CVD techniques, and then etching the oxide layer, leaving vertical portions of this layer intact. As shown, the top portion of the gate electrode is cleared from oxide. Second sidewall spacers 125 are defined adjacent to the first sidewall spacers. These second sidewall spacers are designed to isolate the gate electrode and provide for a subsequent self-aligned implant process.

Silicide 127 is defined overlying the top of the gate electrode 121 and source/drain region 107. This silicide reduces the resistance of these areas to enhance switching characteristics of the device. Silicided regions include a resistance ranging from about 80 to about 1 $\mu$ohms-centimeter, and is often less than 100 $\mu$ohms-centimeter. As shown, the first and second sidewalls isolate the gate electrode from the source/drain regions.

The combination of the silicide and tungsten gate electrode structure reduces the amount of hot electrons that inject into the sidewall spacers. In a submicron channel design, the silicided layer has a length of about 0.7 $\mu$m or less. The gate oxide layer has a length of about 0.5 $\mu$m or less. Each of the second sidewall spacers has a thickness of about 0.3 $\mu$m or less. The tungsten gate electrode has a length of about 0.5 $\mu$m or less. In most embodiments, the length ratios between the two spacers:silicided layer:gate electrode are about (2:5:4). Preferably, the length ratio between the silicided layer and the sidewall spacer is at least (1:4). Accordingly, a substantial portion of the effective gate electrode overlies the channel length. This structure allows fewer electrons to inject into the sidewall spacer.

An embodiment of the present fabrication method may be briefly outlined as follows.

(1) Provide semiconductor substrate.

(2) Grow gate oxide layer.

(3) Deposit silicided layer on gate oxide layer.

(4) Deposit tungsten gate electrode layer.

(5) Deposit nitride layer overlying tungsten gate electrode layer.

(6) Mask 1: Define gate electrode layer to form tungsten gate regions.

(7) Strip nitride layer.

(8) Form first sidewall spacers on the tungsten gate regions.

(9) Mask 2: Define N– type LDD regions and implant (Use of Mask 2 optional).

(10) Densify or anneal.

(11) Remove silicided layer overlying N– type LDD regions using first sidewall spacers as a mask.

(12) Remove gate oxide layer from N– type LDD regions.

(13) Form second sidewall spacers on first sidewall spacers.

(14) Deposit silicide overlying top of tungsten gate electrode and N– type LDD regions.

(15) Mask 3: Define N+ type source/drain regions and implant.

(16) Drive in N+ type dopants from silicided layer into source/drain regions.

(17) Deposit dielectric layers.

(18) Mask 4: Define contact openings.

(19) Sputter aluminum.

(20) Deposit surface passivation layers.

(21) Mask 5: Define pad regions with pad mask.

(22) Perform remaining process steps.

This fabrication method uses a silicided layer defined overlying the gate oxide layer. This silicided layer is substantially non-reactive with the gate oxide layer, and will remain intact during subsequent processing steps. In addition, the silicided layer reduces the resistance of the tungsten gate electrode layer. The double sidewall spacer provides for a self-aligned implant process, creating a more highly integrated device. These fabrication steps are merely an example of the present invention as defined by the claims. Other alternatives, variations, and modifications can be used. Details of this fabrication method may be shown by way of the Figs. below.

FIGS. 3–6 illustrate a fabrication method for the MOS transistor having the inverse-T tungsten gate structure of FIG. 2. This method is merely an illustration and should not limit the scope of the claims as defined herein. One of ordinary skill in the art would recognize other modifications, variations, and alternatives.

Figure 3:
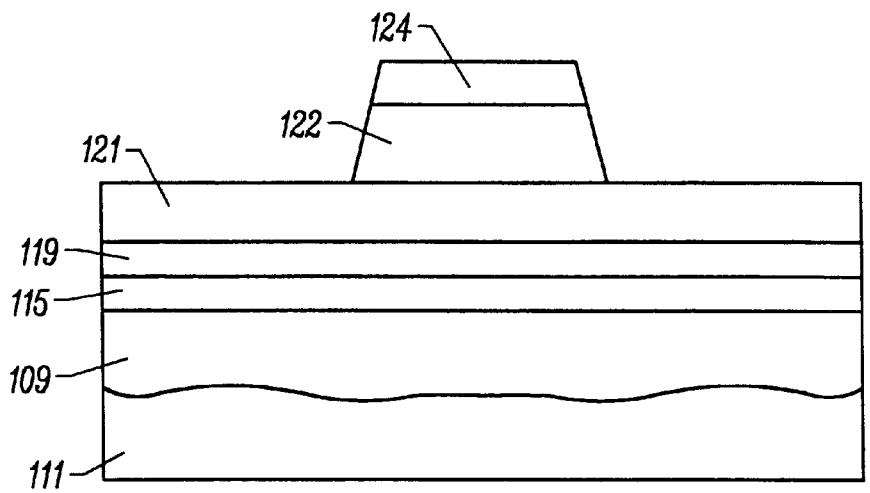
FIGS. 3–6 illustrate a fabrication method for the MOS transistor of FIG. 2.

FIG. 3 illustrates a partially completed semiconductor device. This device includes a semiconductor substrate 111, typically of P-type impurity. Other types of substrates, however, also can be used. A well region 109 is defined in the substrate. This well region can be made using a P-type impurity or a N-type impurity, depending upon the application.

A high quality layer 115 of silicon dioxide is formed overlying the semiconductor substrate. This silicon dioxide layer defines a gate oxide layer for the MOS device. The gate oxide layer is often formed using a thermal oxidation technique. Other techniques also can be used in forming this gate oxide layer. In preferred embodiments, the gate oxide layer is a high quality oxide layer that is substantially pinhole free. This gate oxide layer has a thickness ranging from about 30 nm to about 800 nm, and is preferably less than about 200 nm. Of course, another thickness may also be used.

A layer 119 of silicide is formed overlying the gate oxide layer 115. This silicide layer can be made of almost any suitable elements that adhere well to silicon dioxide and provides selective etching characteristics relative to its underlying material, i.e., silicon dioxide. The silicided layer is also substantially non-reactive with the gate oxide layer.

In a preferred embodiment, the silicide layer is made using a dichlorosilane-based CVD tungsten silicide (CVD DCS-WSi$_x$) material. This silicide layer is made by way of the following reaction.

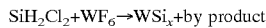

$SiH_2Cl_2 + WF_6 \rightarrow WSi_x + $ by product

This reaction is called the dichlorosilane reduction of tungsten hexafluoride at temperatures above 500° C. However, other temperatures may be used. The reaction occurs in a CVD chamber. The CVD chamber is at a pressure ranging from about 1 mTorr to about 1 Torr. The gases are flowed into the chamber using a ratio of 20:40 (SiH$_2$Cl$_2$ to WF$_6$). The layer is formed at a thickness ranging from about 50 to about 2,000 Å, and is preferably at about several hundred angstroms and less. Of course, this thickness depends upon the application.

After formation, the CVD DCS-WSi$_x$ has a relatively low resistance, as compared to a typical doped polysilicon layer. This low resistance is often 70 μohms and less after annealing. Preferably, the resistivity is about 70 μohms and less. CVD DCS-WSi$_x$ also has a low fluorine content, which tends to have almost no detrimental influence on the underlying gate oxide layer. Other than WSi$_x$, the silicided layer may be formed using titanium silicide, platinum silicide, cobalt silicide, and other materials.

Overlying the silicide is a gate electrode layer 121. In one embodiment, the gate electrode layer is a tungsten layer. This tungsten layer will define the gate electrode structure in later processing steps. In particular, tungsten is deposited by CVD, sputtering, PECVD, or other techniques. An example of a tungsten deposition technique relies upon a reaction between a tungsten hexafluoride (WF$_6$) gas which is reduced using either silicon, hydrogen gas (H$_2$), or a silane gas (e.g., SiH$_4$, etc.). Preferably, tungsten is deposited using a technique such as sputtering. The tungsten layer has a thickness ranging from about 300 Å to about 5,000 Å. Preferably, the thickness of the tungsten layer is several thousand angstroms.

Figure 4:
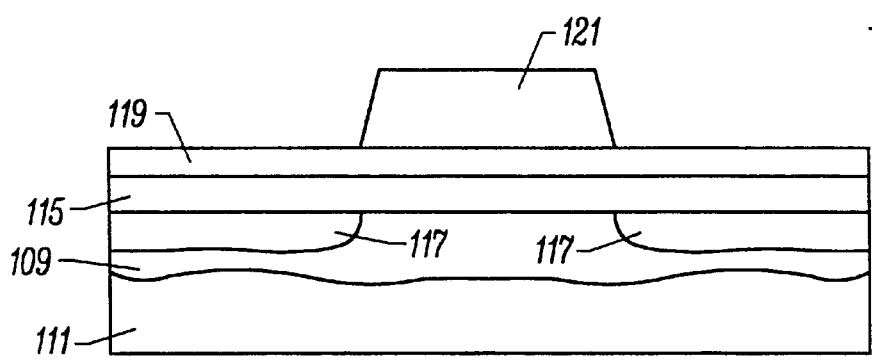

The tungsten layer is defined as a gate electrode using a silicon nitride masking layer 122. The nitride layer is often deposited over the tungsten layer using a plasma-enhanced chemical vapor deposition (PECVD) technique. A resist mask 124 is applied over the nitride layer 122 and is patterned to define the gate electrode. The gate electrode has a length ranging from about 0.1 μm to about 3 μm, and is preferably about 0.5 microns and less. The tungsten layer is patterned using a plasma etch or reactive ion etch (RIE) and the nitride layer as the mask. After patterning the tungsten layer to form the gate electrodes, the resist and nitride mask are stripped using standard techniques, as shown in FIG. 4.

This method then provides implants to define the LDD regions 117. These LDD regions are made by implanting dopants directly into the source/drain regions through the silicide layer. In other embodiments, the power and dose are adjusted such that the implant just penetrates into the silicide layer, but does not penetrate into the semiconductor substrate. The implant does not penetrate and reach active areas of the gate oxide layer. By selectively implanting the silicide layer, implant damage does not occur to the semiconductor substrate or the gate oxide layer.

In the formation of NMOS devices, the LDD implants are N-type impurities. These impurities are often a phosphorous-type impurity. The concentration of the impurity ranges from about $1 \times 10^{12}$ to about $1 \times 10^{14}$, and is preferably at about $1 \times 10^{13}$. Of course, the impurity used will depend upon the application.

Figure 5:
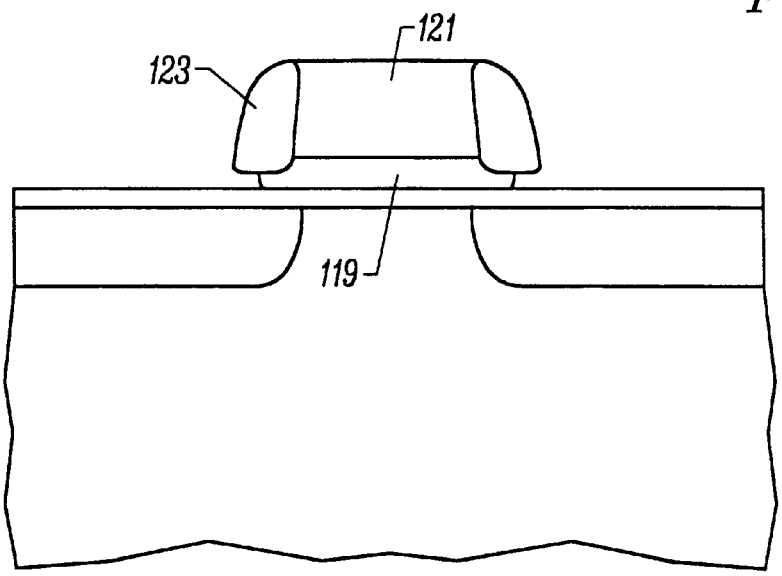

A sidewall spacer 123 is formed around the tungsten gate electrode, as shown in FIG. 5. The sidewall spacer is made by forming a dielectric layer (e.g., silicon dioxide, silicon nitride, etc.) overlying the gate electrode. In most embodiments, the dielectric layer is often formed using CVD techniques. A step of etching this layer defines the sidewall spacer. The etching step substantially removes horizontal portions of this layer, leaving the vertical portions around the tungsten gate electrode intact. The sidewall spacer also extends laterally over a portion 118 of the silicide layer.

An annealing step densities the sidewall spacer 123 to isolate or seal the tungsten gate electrode from overlying device elements. Annealing typically occurs at a temperature ranging from about 500° C. to about 1,000° C., but is preferably less than about 800° C. In preferred embodiments, annealing also drives in and removes defects in the silicon substrates caused by the implant step. Accordingly, concurrent with the annealing step, the LDD regions become defined as the impurities implanted into (or through) the silicide layer diffuse through the silicided layer, through the gate oxide layer, and into the silicon substrate. In preferred embodiments, the gate oxide layer beneath the gate electrode is protected by the silicide layer throughout this entire process. That is, neither ion implantation nor plasma etching or RIE damages the gate oxide layer underlying the gate electrode.

An etching step then removes the silicide layer 120 extending outside the sidewall spacer. This etching step occurs using a plasma etch or RIE apparatus and the gate electrode and sidewall spacer as a mask. In most embodiments, the etching is highly selective between the silicided layer and the substrate. As shown in FIG. 5, a small gap is defined between the bottom of each spacer and the gate oxide layer. This small gap may characterize this present technique. The gate oxide layer defined in the source/drain regions is also removed. This occurs using conventional etching techniques, which have high selectivity between silicon and silicon dioxide.

Figure 6:
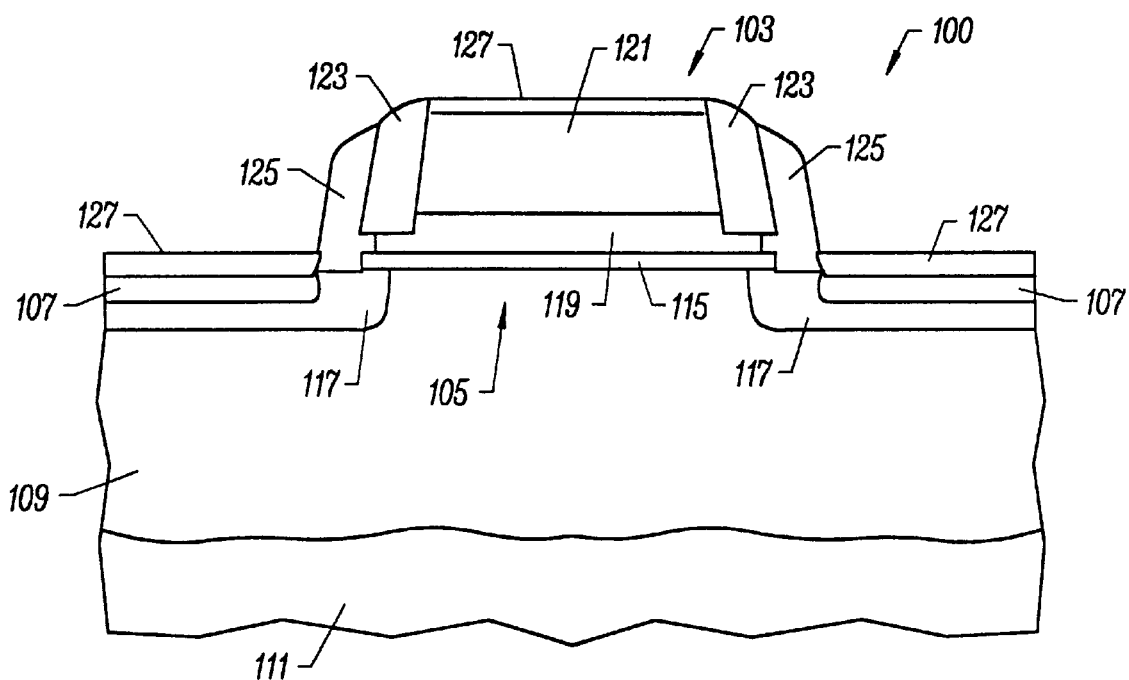

A second set of sidewall spacers 125 is defined over the gate electrode sidewalls, as shown in FIG. 6. In one embodiment, these spacers are made by depositing a dielectric layer overlying the top surface of the device. This dielectric layer can be a CVD oxide. A step of etching removes horizontal portions of the dielectric layer leaving vertical portions along the first sidewall spacers intact. The second set of spacers prevents the gate electrode from shorting to the source/drain regions. This second set of spacers effectively isolates the gate electrode for adjacent circuit elements such as these source/drain regions, contacts to the source/drain regions, and other circuit elements.

A silicide layer 127 is defined overlying the top surface of the gate electrode. This silicide layer reduces the resistance of the gate electrode and provides a barrier between the gate electrode and overlying device elements. In preferred embodiments, the silicide is defined overlying the top surface of the source/drain regions at the same time as the silicide is formed on the gate electrode. This silicide can be any suitable material for reducing the resistance of the source/drain contact regions, and for providing a barrier thereto. An example of this type of material is platinum silicide, tungsten silicide, or titanium silicide.

Subsequent to the formation of silicide, an implantation step occurs into the silicide to define source/drain regions(s) 107. This implantation step introduces impurities into the silicide layer, thereby preventing damage to the underlying silicon substrate. Alternatively, the implantation may be implanted through the silicided layer. A thermal anneal step follows this implantation step to drive impurities from the silicide into the silicon or source/drain region(s) 107. This also reduces contact and series resistance of the device.

Other processing steps are performed to complete fabrication of the device. These processing steps include formation of a interlayer dielectric material, formation of metallization layers, deposition of a passivation layer, formation of openings for bonding pads, and others. Of course, the exact sequence of steps used by this method will depend upon the application.

While the above is a full description of the specific embodiments, various modifications, alternative constructions and equivalents may be used. For example, while the description above is in terms of an inverse-T MOS structure, it would be possible to implement the present invention with almost any tungsten gate structure, or the like. The embodiments shown may comprise, for example, NMOS devices. Alternatively, these regions may comprise PMOS devices. Therefore, the above description and illustrations should not be taken as limiting the scope of the present invention which is defined by the appended claims.

What is claimed is:

1. A semiconductor device, said semiconductor device comprising:
   a semiconductor substrate having an overlying gate insulating layer;
   a first silicided layer overlying said gate insulating layer wherein said first silicided layer is substantially non-reactive to said gate insulating layer; and
   a gate electrode overlying said first silicided layer, said first silicided layer extending laterally from said gate electrode.

2. The device of claim 1 wherein said gate insulating layer is an oxide layer.

3. The device of claim 1 further comprising a lightly doped drain region adjacent to said gate electrode.

4. The device of claim 3 further comprising first sidewall spacers defined adjacent to said gate electrode.

5. The device of claim 4 further comprising second sidewall spacers defined adjacent to said first sidewall spacers.

6. The device of claim 5 further comprising a second silicided layer overlying said gate electrode and said lightly doped drain region.

7. The device of claim 6 further comprising source/drain regions defined adjacent to said gate electrode.

8. The semiconductor device of claim 1, wherein the gate electrode comprises one of a group consisting of tungsten, titanium, and polysilicon.

9. The semiconductor device of claim 1 wherein the first silicided layer comprises one of the group consisting of tungsten silicide, titanium silicide, platinum suicide, and cobalt silicide.

10. The semiconductor device of claim 7 wherein the source/drain regions are offset from said gate electrode.

11. The semiconductor device of claim 1 wherein the length ratio between the first silicided layer and the gate electrode is about 5:4.

12. The semiconductor device of claim 1 wherein the first silicided layer extends laterally from both sides of the gate electrode.

13. A semiconductor device, said semiconductor device comprising:
   a semiconductor substrate
   a gate insulating layer overlying said semiconductor substrate;
   a first silicided layer overlying said gate insulating layer wherein said first silicided layer is substantially non-reactive to said gate insulating layer;
   a gate electrode overlying said first silicided layer, said first silicided layer extending laterally from said gate electrode;
   a lightly-doped drain region in the semiconductor substrate adjacent to the gate electrode;
   a sidewall spacer adjacent to the gate electrode; and
   a source/drain region in the lightly-doped drain region adjacent to said sidewall spacer.

14. The semiconductor device of claim 13 further comprising a second silicided layer overlying the gate electrode and the source/drain region.

15. The semiconductor device of claim 13 wherein the gate electrode comprises one of a group consisting of tungsten, titanium, and polysilicon.

16. The semiconductor device of claim 13 wherein the first silicided layer comprises one of the group consisting of tungsten silicide, titanium silicide, platinum silicide, and cobalt silicide.

17. A semiconductor device, said semiconductor device comprising:
   a semiconductor substrate having an overlying gate insulating layer;
   a first silicided layer overlying said gate insulating layer; and
   a gate electrode overlying said first silicided layer, said first silicided layer extending laterally from said gate electrode wherein the length ratio between the first silicided layer and the gate electrode is about 5:4.

* * * * *